United States Patent
Liou et al.

(10) Patent No.: US 10,164,039 B2
(45) Date of Patent: Dec. 25, 2018

(54) SEMICONDUCTOR DEVICE HAVING METAL GATE

(71) Applicant: UNITED MICROELECTRONICS CORP., Hsin-Chu (TW)

(72) Inventors: En-Chiuan Liou, Tainan (TW);
Chih-Wei Yang, Kaohsiung (TW);
Yu-Cheng Tung, Kaohsiung (TW)

(73) Assignee: UNITED MICROELECTRONICS CORP., Hsin-Chu (TW)

( * ) Notice: Subject to any disclaimer, the term of this patent is extended or adjusted under 35 U.S.C. 154(b) by 0 days.

(21) Appl. No.: 15/283,445

(22) Filed: Oct. 3, 2016

(65) Prior Publication Data

US 2017/0025512 A1 Jan. 26, 2017

Related U.S. Application Data

(62) Division of application No. 14/704,994, filed on May 6, 2015, now Pat. No. 9,490,341.

(30) Foreign Application Priority Data

Apr. 1, 2015 (TW) .............................. 104110713 A

(51) Int. Cl.
| | |
|---|---|
| *H01L 29/76* | (2006.01) |
| *H01L 29/423* | (2006.01) |
| *H01L 29/66* | (2006.01) |
| *H01L 21/28* | (2006.01) |
| *H01L 29/49* | (2006.01) |
| *H01L 21/768* | (2006.01) |

(52) U.S. Cl.
CPC .. *H01L 29/42376* (2013.01); *H01L 21/28008* (2013.01); *H01L 21/76834* (2013.01); *H01L 21/76897* (2013.01); *H01L 29/4232* (2013.01); *H01L 29/4966* (2013.01); *H01L 29/6653* (2013.01); *H01L 29/66545* (2013.01); *H01L 21/28088* (2013.01)

(58) Field of Classification Search
CPC ......... H01L 29/42376; H01L 21/28008; H01L 21/76834; H01L 21/76897; H01L 29/4232; H01L 29/4966; H01L 29/6653; H01L 29/66545
See application file for complete search history.

(56) References Cited

U.S. PATENT DOCUMENTS

| | | | |
|---|---|---|---|
| 6,310,367 B1 | 10/2001 | Yagishita | |
| 6,514,856 B2 | 2/2003 | Matsumoto | |

(Continued)

*Primary Examiner* — Victor A Mandala
*Assistant Examiner* — Colleen E Snow
(74) *Attorney, Agent, or Firm* — Winston Hsu

(57) ABSTRACT

A semiconductor device having metal gate includes a substrate, a metal gate formed on the substrate, a pair of spacers formed on sidewalls of the metal gate, a contact etch stop layer (CESL) covering the spacers, an insulating cap layer formed on the metal gate, the spacers and the CESL, and an ILD layer surrounding the metal gate, the spacers, the CESL and the insulating cap layer. The metal gate, the spacers and the CESL include a first width, and the insulating cap layer includes a second width. The second width is larger than the first width. And a bottom of the insulating cap layer concurrently contacts the metal gate, the spacers, the CESL, and the ILD layer.

7 Claims, 5 Drawing Sheets

(56) References Cited

U.S. PATENT DOCUMENTS

| | | | |
|---|---|---|---|
| 6,534,813 B1* | 3/2003 | Park | H01L 21/76895 |
| | | | 257/300 |
| 7,985,690 B2* | 7/2011 | Thei | H01L 21/823842 |
| | | | 257/E21.006 |
| 8,436,404 B2 | 5/2013 | Bohr et al. | |
| 8,481,415 B2* | 7/2013 | Yuan | H01L 21/76897 |
| | | | 438/183 |
| 8,679,909 B2 | 3/2014 | Xie | |
| 9,209,273 B1* | 12/2015 | Lin | H01L 29/4232 |
| 2015/0035086 A1 | 2/2015 | Xie et al. | |
| 2016/0149016 A1* | 5/2016 | Farmer | H01L 21/0226 |
| | | | 257/401 |

\* cited by examiner

SEMICONDUCTOR DEVICE HAVING METAL GATE

CROSS REFERENCE TO RELATED APPLICATIONS

This application is a division of U.S. application Ser. No. 14/704,994 filed on May, 6, 2015, and incorporated herein by reference in its entirety.

BACKGROUND OF THE INVENTION

1. Field of the Invention

The invention relates to a semiconductor device having metal gate and a manufacturing method thereof, and more particularly, to a semiconductor device having metal gate and a manufacturing method capable of avoiding gate-to-contact short (hereinafter abbreviated as GC short) issue.

2. Description of the Prior Art

With a trend toward scaling down the size of the semiconductor device, work function metals are used to replace the conventional polysilicon gate to be the control electrode that competent to the high dielectric constant (herein after abbreviated as high-k) gate dielectric layer. The conventional metal gate methods are categorized into the gate-first process and the gate-last process. Among the two main processes, the gate-last process is able to avoid processes of high thermal budget and to provide wider material choices for the high-k gate dielectric layer and the metal gate, and thus the gate last process gradually replaces the gate-first process.

In the conventional gate-last process, a dummy gate or a replacement gate is formed on a substrate and followed by steps of forming a conventional metal-oxide semiconductor (hereinafter abbreviated as MOS) semiconductor device. Subsequently, the dummy/replacement gate is removed to form a gate trench. Then the gate trench is filled up with work function metals required by different conductivity types. Subsequently, contact plugs and interconnections are built and thus integrated circuits (ICs) are constructed. It is noteworthy that during forming contact openings, which expose the substrate, in the interlayer dielectric (hereinafter abbreviated as ILD) layer, metal gates are often exposed because of misalignment or because the huge vertical deviation between the ILD layer on the substrate and the ILD layer on the metal gate. Eventually, conduct material filling up the contact openings contacts the exposed metal gate, the so-called gate-to-contact (GC) short issue not only adversely impacts IC performance but also become one of the major reason that limiting the process window.

SUMMARY OF THE INVENTION

According to an aspect of the present invention, a method for manufacturing a semiconductor device having metal gate is provided. The method for manufacturing the semiconductor device having metal gate includes following steps: A substrate is provided. At least a transistor including a dummy gate is formed on the substrate and the transistor is embedded in an ILD layer. A first removal process is performed to remove a portion of the dummy gate to form a first recess in the transistor. An etching process is subsequently performed to remove a portion of the ILD layer to widen the first recess and to form a widened first recess. A second removal process is subsequently performed to remove the dummy gate entirely and to form a second recess in the transistor. A metal gate is formed in the second recess and followed by forming an insulating cap layer on the metal gate.

According to an aspect of the present invention, a semiconductor device having metal gate is provided. The semiconductor device having metal gate includes a substrate, a metal gate formed on the substrate, a pair of spacers formed on sidewalls of the metal gate, a contact etch stop layer (hereinafter abbreviated as CESL) covering the spacers, an insulating cap layer formed on the metal gate, the spacers and the CESL, and an ILD layer surrounding the metal gate, the spacers, the CESL and the insulating cap layer. The metal gate, the spacers and the CESL include a first width, and the insulating cap layer includes a second width. The second width is larger than the first width. And a bottom of the insulating cap layer concurrently contacts the metal gate, the spacers, the CESL, and the ILD layer.

According to an aspect of the present invention, another semiconductor device having metal gate is provided. The semiconductor device having metal gate includes a substrate, a metal gate formed on the substrate, a pair of spacers formed on sidewalls of the metal gate, an insulating cap layer formed on the metal gate and the spacers, and an ILD layer surrounding the metal gate, the spacers and the insulating cap layer. The metal gate and the spacers include a first width, and the insulating cap layer includes a second width. The second width is larger than the first width. And a bottom of the insulating cap layer entirely and only contacts the metal gate.

According to the semiconductor device having metal and the method for manufacturing the semiconductor device having metal gate provided by the present invention, two-stepped removals are performed to remove the dummy gate. More important, the two-stepped removals are interrupted by the etching process performed to remove the portion of the ILD layer. Consequently, the widened first recess including a width larger than an original width of the dummy gate and the second recess including a width the same with the original width of the dummy gate are obtained. Thereafter, the insulating cap layer formed in the widened first recess obtains the width larger than the metal gate, which obtains the width the same with the dummy gate. More important, since the width of the insulating cap layer is larger than the width of the metal gate, the insulating cap layer obstructs the etchant used in an etching process for forming contact openings and protects the metal gate from being exposed during forming the contact openings. And thus the conductive material formed in the contact opening will not contact the metal gate. Briefly speaking, the present invention provides the semiconductor device having metal and the method for manufacturing the semiconductor device having metal gate capable of avoiding GC short.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

FIGS. 1-8 are drawings illustrating a method for manufacturing a semiconductor device having metal gate provided by a preferred embodiment of the present invention, wherein FIG. 2 is a schematic drawing in a step subsequent to FIG. 1, FIG. 3 is a schematic drawing in a step subsequent to FIG. 2, FIG. 4 is a schematic drawing in a step subsequent to FIG. 3, FIG. 5 is a schematic drawing in a step subsequent to FIG. 4, FIG. 6 is a schematic drawing in a step subsequent to FIG. 5, FIG. 7 is a schematic drawing in a step subsequent to FIG. 6, and FIG. 8 is a schematic drawing in a step subsequent to FIG. 7.

DETAILED DESCRIPTION

Figure 1:
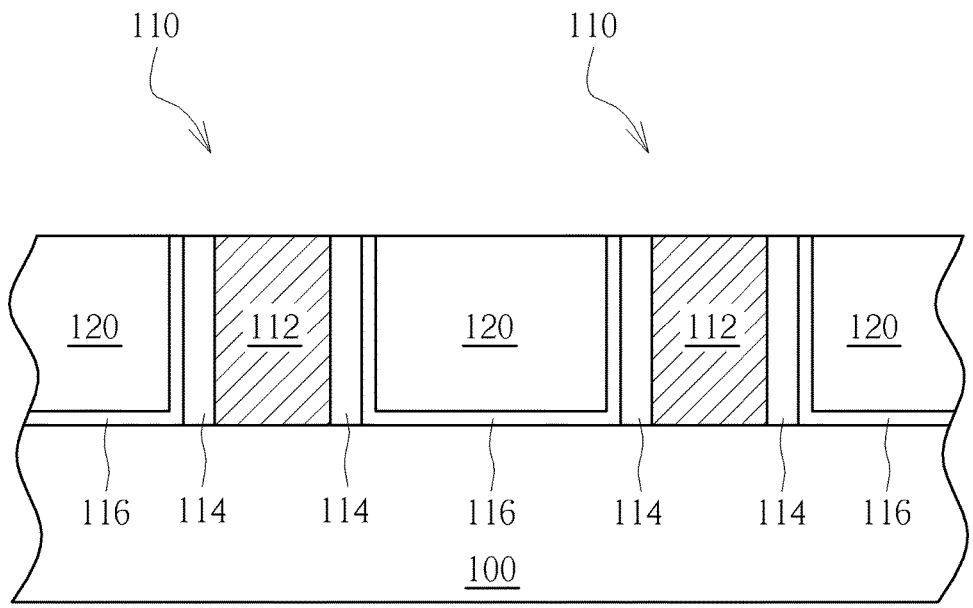

Please refer to FIGS. 1-8, which are drawings illustrating a method for manufacturing a semiconductor device having metal gate provided by a preferred embodiment of the present invention. As shown in FIG. 1, the preferred embodiment first provides a substrate such as a silicon substrate, a silicon-containing substrate, or a silicon-on-insulator (SOI) substrate. The substrate includes a plurality of shallow trench isolations (hereinafter abbreviated as STIs) (not shown), and the STIs are used to define a plurality of active regions for accommodating p-typed transistors and n-typed transistors, and to provide electrical isolation. In the preferred embodiment, a semiconductor layer such as a fin structure involved in fin field effect transistor (FinFET) approach is provided. The fin structure as shown in FIG. 1 can be formed by patterning a single crystalline silicon layer of a SOI substrate or a bulk silicon substrate by photolithographic etching pattern (PEP) method, multi patterning method, Or, preferably, spacer self-aligned double-patterning (SADP), also known as sidewall image transfer (SIT) method. And the fin structure is taken as the substrate 100 in the preferred embodiment. At least a transistor 110 is formed on the substrate 100. According to the preferred embodiment, the transistor 110 can be a p-typed transistor or an n-typed transistor.

The transistor 110 includes a dielectric layer (not shown), a dummy gate or a replacement gate 112 such as a polysilicon layer or an amorphous silicon layer, and a patterned hard mask (not shown). The dielectric layer 102 can be a conventional silicon oxide (SiO) layer in the preferred embodiment, but not limited to this. Furthermore, the transistor 110 includes lightly doped drains (LDDs) (not shown), spacers 114 formed on sidewall of the dummy gate 112, and a source/drain (not shown). The spacers 114 can be multi-layered structures, but not limited to this. Furthermore, selective strain scheme (SSS) can be used in the preferred embodiment. For example, a selective epitaxial growth (SEG) method can be used to form the source/drain. When the transistor 110 is the p-typed transistor, epitaxial silicon layers of SiGe are used to form the source/drain. When the transistor 110 is the n-typed transistor, epitaxial silicon layers of SiC or SiP are used to form the source/drain. Additionally, salicides (not shown) can be formed on the source/drain. After forming the transistor 110, an etch liner such as a CESL 116 is selectively formed on the semiconductor layer/the substrate 100, and an ILD layer 120 is subsequently formed. Next, a planarization process such as chemical mechanical polishing (CMP) process is performed to planarize the ILD layer 120 and the CESL 116. Furthermore, the planarization process is performed to remove the patterned hard mask, such that the dummy gate 112 is exposed. As shown in FIG. 1, the transistor 110 is embedded in the ILD layer 120. In other words, the ILD layer 120 surrounds the transistor 110.

Figure 2:
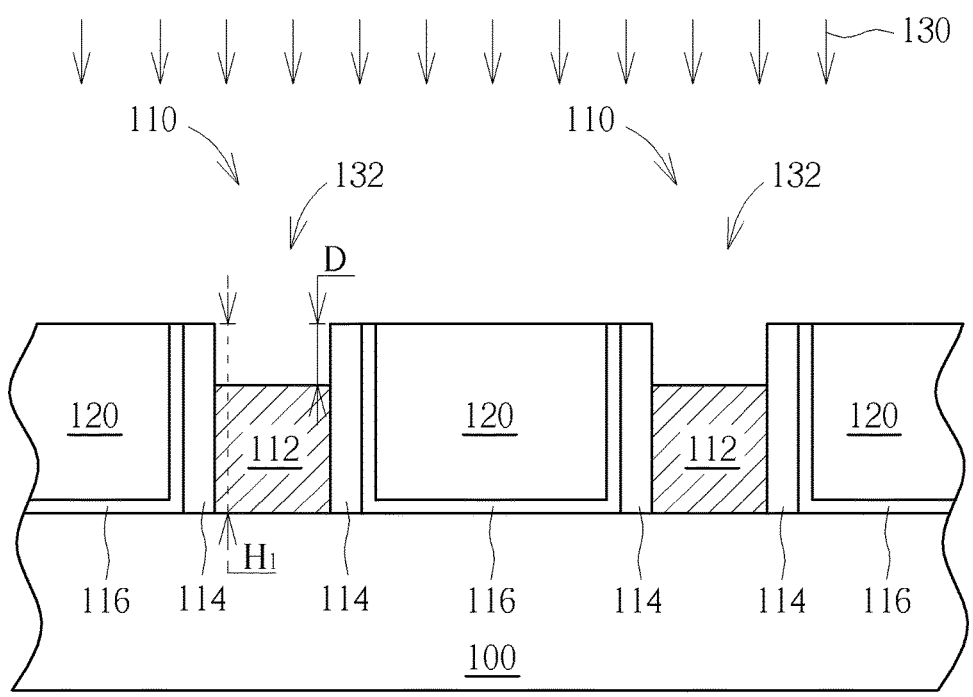

Please refer to FIG. 2. Then, a first removal process 130 is performed to remove a portion of the dummy gate 112. Such that a first recess 132 is formed in the transistor 110. It should be noted that the first recess 132 includes a depth D while the dummy gate 112 includes an original height $H_1$ before the first removal process 130. According to the preferred embodiment, the depth D is between one-half and one-third of the original height $H_1$. For example, the original height $H_1$ of the dummy gate 112 is 700 angstrom (Å) and the depth D of the first recess 132 (also is a thickness of the dummy gate 112 being removed) is 300 Å, but not limited to this.

Figure 3:
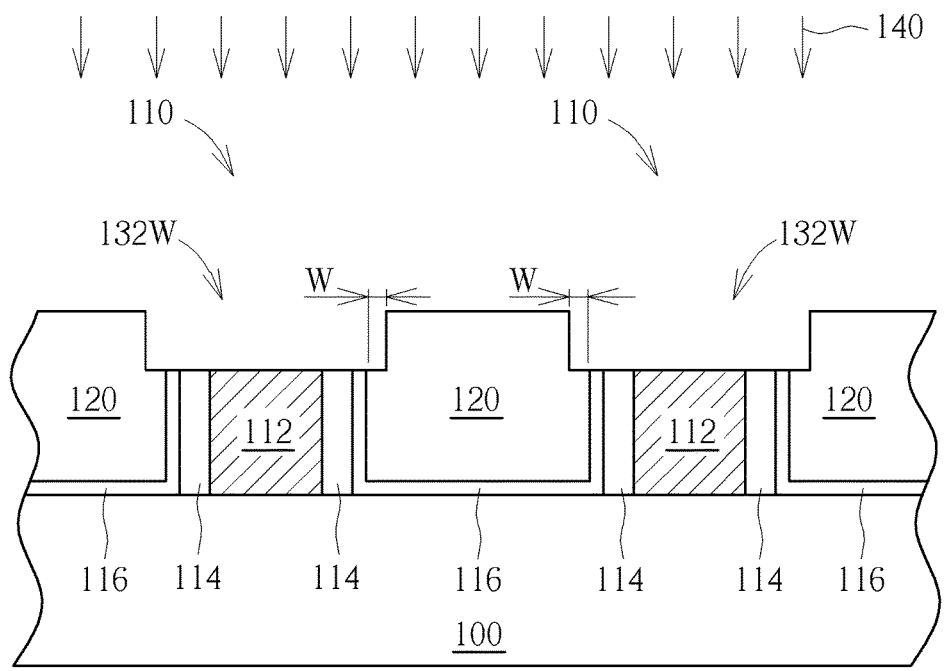

Please refer to FIG. 3. After forming the first recess 132, an etching process 140 is performed to remove a portion of the spacers 114, a portion of the CESL 116, and a portion of the ILD layer 120. Thus the first recess 132 is widened and a widened first recess 132W is obtained. It is noteworthy that, in the semiconductor manufacturing process, the dummy gate 112 includes semiconductor material such as the polysilicon or the amorphous silicon, while the spacers 114, the CESL 116 and the ILD layer 120 often include insulating materials. Therefore, an etchant including higher etching rate for the insulating materials is used in the etching process 140, and thus the portion of the spacers 114, the portion of the CESL 116 and the portion of the ILD layer 120 are removed without consuming or damaging the dummy gate 112. More important, the portion of the ILD layer 120 being removed by the etching process 140 includes a width W, and the width W is between 3 nanometers (hereinafter abbreviated as nm) and 8 nm, but not limited to this. Accordingly, the width of the widened first recess 132W is a sum of the original width of the dummy gate 112, thickness of the spacers 114 formed on two sides of the dummy gate 112, thickness of the CESL formed on the two sides of the dummy gate 112, and the portion of the ILD layer 120 being removed by the etching process 140.

Figure 4:
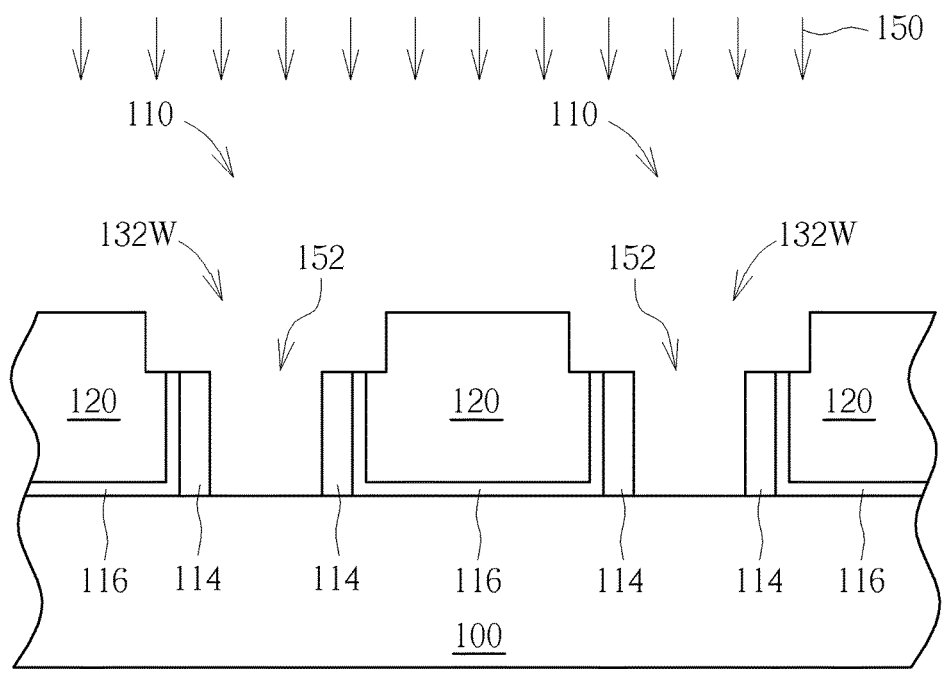

Please refer to FIG. 4. After forming the widened first recess 132W, a second removal process 150 is performed to remove the dummy gate 112 entirely. Thus, a second recess 152 is formed in the transistor 110. As mentioned above, the material of the dummy gate 112 is different from the materials of the spacers 114, the CESL 116 and the ILD layer 120. Therefore, an etchant including higher etching rate for the semiconductor material is used in the second removal process 150. And thus the remnant dummy gate 112 is removed to form the second recess 152 without impacting the widened first recess 132W.

Figure 5:
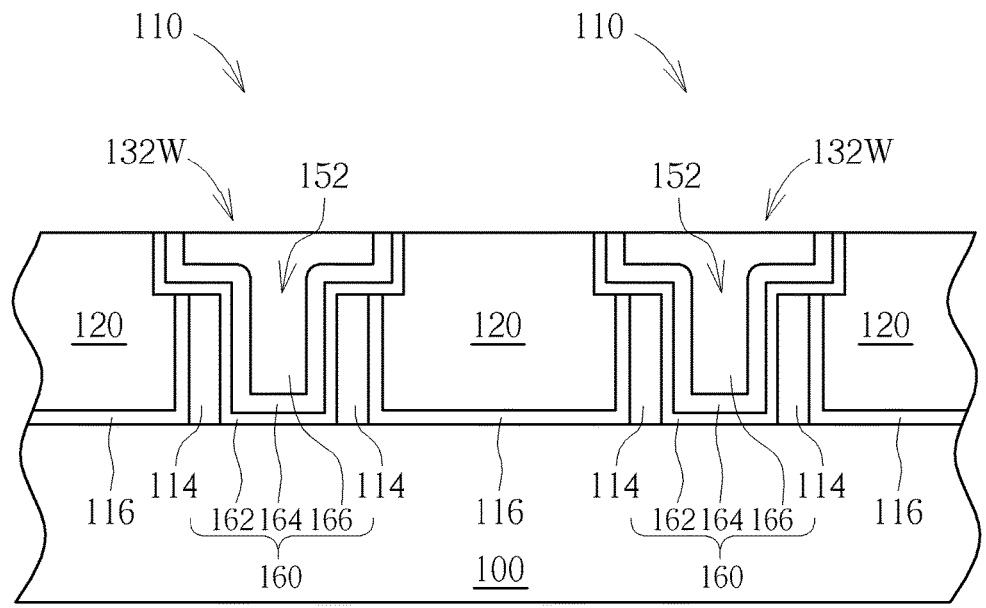

Please refer to FIG. 5. After forming the second recess 152, a high-k gate dielectric layer 162 is formed in the widened first recess 132W and the second recess 152. The high-k gate dielectric layer 162 is used to replace the conventional silicon oxide to be the gate dielectric layer for decreasing physical limit thickness, reducing leakage current, and obtaining equivalent capacitor in an identical equivalent oxide thickness (EOT). The high-k gate dielectric layer 162 can include high-k material selected from the group consisting of silicon nitride (SiN), silicon oxynitride (SiON) and metal oxide. And the metal oxide can include hafnium oxide (HfO), hafnium silicon oxide (HfSiO), hafnium silicon oxynitride (HfSiON), aluminum oxide (AlO), lanthanum oxide (LaO), lanthanum aluminum oxide (LaAlO), tantalum oxide (TaO), zirconium oxide (ZrO), strontium zirconium silicon oxide (ZrSiO), or hafnium zirconium oxide (HfZrO), but not limited to this. It is noteworthy that the preferred embodiment is integrated with the high-k last process, and the dielectric layer originally formed in the bottom of the dummy gate 112 serves as interfacial layer (IL). The interfacial layer provides a superior interface between the substrate 100 and the high-k gate dielectric layer 162. However, the method for manufacturing the semiconductor device having the metal gates can be integrated with a high-k first process according to a modification to the preferred embodiment. In such modification, the dielectric layer originally formed in the bottom of the dummy gate 112 can be formed of the abovementioned high-k materials, but not limited to this.

Please refer to FIG. 5 again. Next, a plurality of metal layers are formed in the widened first recess 132W and the second recess 152. It should be noted that since the width of the widened first recess 132W is larger than the width of the second recess 152, the metal layers can be formed in the second recess 152 more smoothly. Consequently, gap-filling result is improved and seam conventionally found in the metal layers is avoided. The metal layers include at least a work function metal layer 164 and a filling metal layer 166. When the transistor 110 is the p-typed transistor, the work function metal layer 164 is a p-typed work function metal layer and exemplarily includes TiN, TaN, titanium carbide (TiC), tantalum carbide (TaC), tungsten carbide (WC), or aluminum titanium nitride (TiAlN), but not limited to this. It should be easily realized that when the transistor 110 is a p-typed transistor, the work function metal layer 164 can include any suitable metal material having a work function between about 4.8 eV and about 5.2 eV. When the transistor 110 is the n-typed transistor, the work function metal layer 164 is an n-typed work function metal layer such as titanium aluminide (TiAl), zirconium aluminide (ZrAl), tungsten aluminide (WAl), tantalum aluminide (TaAl), or hafnium aluminide (HfAl), but not limited to this. As mentioned above, when the transistor 110 is the n-typed transistor, the work function metal layer 164 can include any suitable metal materials having a work function between about 3.9 eV and about 4.3 eV. In addition, the work function metal layer 164 can be a single-layered structure or a multi-layered structure. The filling metal layer 166 includes materials with low resistance and superior gap-filling characteristic, the materials can be selected from the group consisting of Al, Ti, Ta, W, Nb, Mo, Cu, TiN, TiC, TaN, Ti/W and Ti/TiN, but not limited to this. Furthermore, the metal layers can include a bottom barrier layer (not shown), an etch stop layer (not shown), and/or a top barrier layer (not shown) if required.

Please still refer to FIG. 5. After forming the filling metal layer 166, a planarization process is performed to remove superfluous metal layers 164/166 and high-k gate dielectric layer 162. Consequently, a metal gate 160 is formed on the substrate 100.

Figure 6:
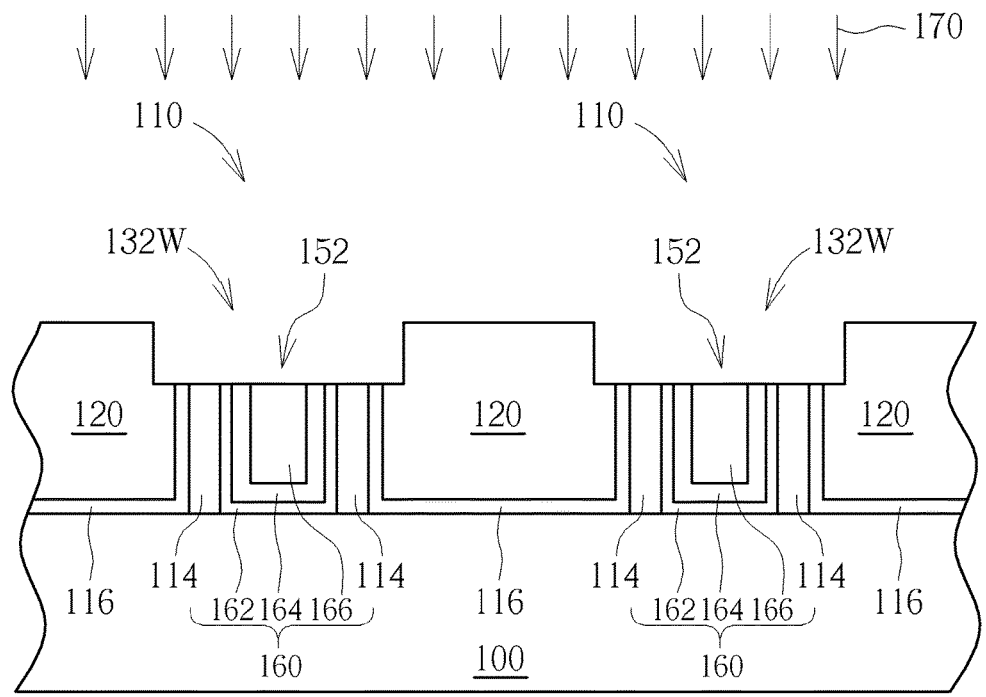

Please refer to FIG. 6. After forming the metal gate 160, a metal etching process 170 is performed to remove a portion of the metal gate 160 from the widened first recess 132W. According to the preferred embodiment, a top surface of the metal gate 160 and a bottom surface of the widened first recess 132W are coplanar after the metal etching process 170, as shown in FIG. 6. In other words, the metal gate 160 remains only in the second recess 152 after the metal etching process 170.

Figure 7:
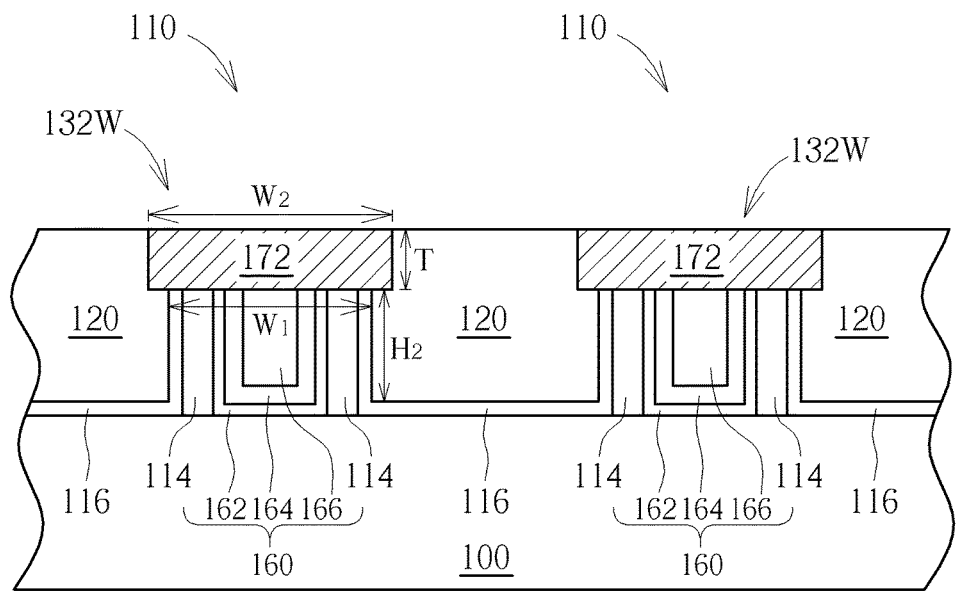

Please refer to FIG. 7. Next, an insulating cap layer 172 is formed on the metal gate 160 and the spacers 114. In the preferred embodiment, the insulating cap layer 172 is formed by deposition and planarization processes. It is noteworthy that the insulating cap layer 172 is formed to fill up the widened first recess 132W and a top surface of the insulating cap layer 172 and a top surface of the ILD layer 120 are coplanar. Furthermore, a cross-sectional view of the insulating cap layer 172 includes a rectangle as shown in FIG. 7.

Please still refer to FIG. 7. Consequently, the metal gate 160, the spacers 114 formed on the two sides of the metal gate 160 and the CESL 116 formed on the two sides of the metal gate 160 include a first width $W_1$ while the insulating cap layer 172 includes a second width $W_2$. The second width $W_2$ is larger than the first width $W_1$. It is also noteworthy that a bottom of the insulating cap layer 172 concurrently contacts a top of metal gate 160, tops of the spacers 114, tops of the CESL 116, and the ILD layer 120, as shown in FIG. 7. Furthermore, the ILD layer 120 surrounding the metal gate 160, the spacers 114, the CESL 116 and the insulating cap layer 172 often includes silicon oxide (SiO), borophosphosilicate glass (BPSG), spin-on glass (SOG), or fluorosilicate glass (FSG). Therefore, the insulating cap layer 172 concurrently contacts the top of the metal gate 160 (including metal material), the tops of the spacers (including insulating material), the tops of the CESL 116 (including insulating material), and the ILD layer 120 (including silicon oxide material as mentioned above). Additionally, a height $H_2$ of the metal gate 160 and a thickness T of the insulating cap layer 172 include a ratio, and the ratio is between 1 and 1.5, but not limited to this.

Figure 8:
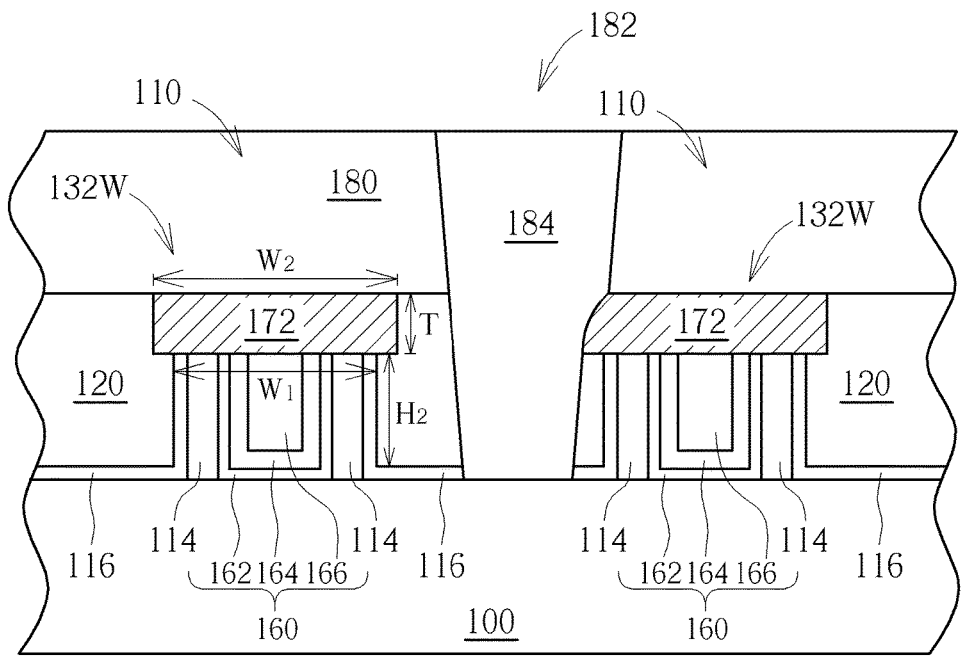

Please refer to FIG. 8. After forming the insulating cap layer 172, an insulating layer 180 is formed on the substrate 100, and at least a contact opening 182 is formed in the insulating layer 180. It should be noted that since the second width $W_2$ of the insulating cap layer 172 is larger than the first width $W_1$ of the metal gate 160, the spacers 114 and the CESL 116, the insulating cap layer 172 serves as a firm and hard protecting shield. For example, during forming the contact opening 182 in self-aligned contact (SAC) technique, the insulating cap layer 172 obstructs the etchant and protects the metal gate 160 and the ILD layer 120 when the etchant approaches the metal gate 160. As shown in FIG. 8, therefore the metal gate 160 is always prevented from being exposed in the contact opening 182 by the insulating cap layer 172 no matter the contact opening 182 is self-aligned formed or a misalignment defect is occurred. Subsequently, conductive material is formed to fill up the contact opening 182 to form a contact plug 184. Consequently, short between the metal gate 160 and the contact plug 184 is avoided. That is, GC short issue is avoided.

Figure 9:
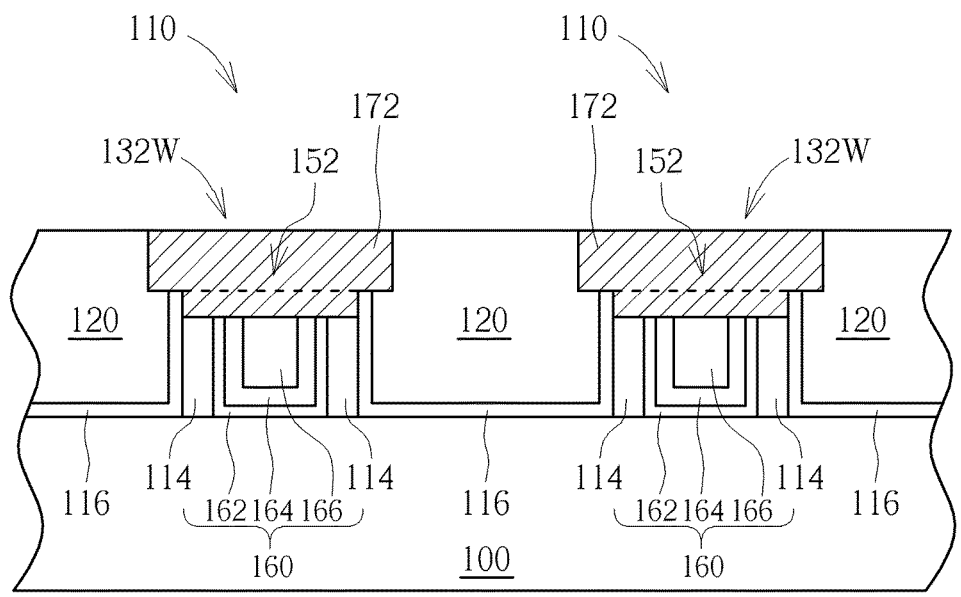
FIG. 9 is a schematic drawing illustrating a modification to the preferred embodiment.

Please refer to FIG. 9, which is schematic drawing illustrating a modification to the preferred embodiment. It should be easily understood that elements the same in the modification and the aforementioned preferred embodiment are designated by the same numerals and formed by the same material. Thus, details about those elements the same in the modification and the aforementioned preferred embodiment are omitted in the interest of brevity. The difference between the modification and the aforementioned preferred embodiment is: During performing the metal etching process 170, the metal gate 160 is removed not only from the widened first recess 132W, but also removed from the second recess 152. Therefore, a top surface of the metal gate 160 is lower than the bottom of the widened first recess 132W (depicted by the dotted line) after the metal etching process 170. Subsequently, the insulating cap layer 172 is formed in the widened first recess 132W and a portion of the second recess 152 by the deposition and planarization processes. As mentioned above, the insulating cap layer 172 is formed to fill up the widened first recess 132W, and a top surface of the insulating cap layer 172 and the top surface of the ILD layer 120 are coplanar. Additionally, a height $H_2$ of the metal gate 160 and a thickness T of the insulating cap layer 172 include a ratio, and the ratio is between 1 and 1.5, but not limited to this. Furthermore, a cross-sectional view of the insulating cap layer 172 includes a T shape, as shown in FIG. 9, according to the modification.

Figure 10:
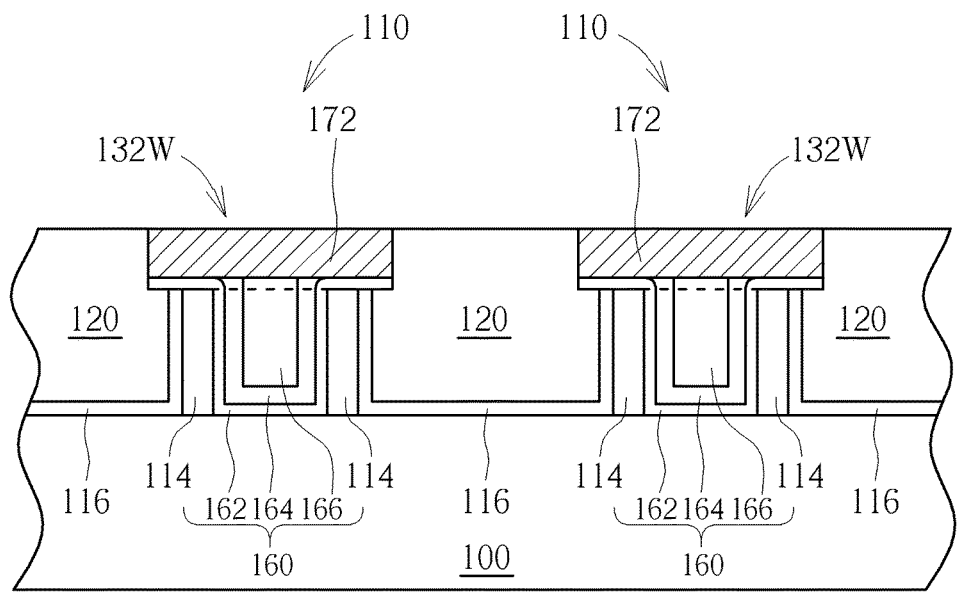
FIG. 10 is a schematic drawing illustrating another modification to the preferred embodiment.

Please refer to FIG. 10, which is schematic drawing illustrating another modification to the preferred embodiment. It should be easily understood that elements the same in the modification and the aforementioned preferred embodiment are designated by the same numerals and formed by the same material. Thus, details about those elements the same in the modification and the aforementioned preferred embodiment are omitted in the interest of brevity. The difference between the modification and the aforementioned preferred embodiment is: During performing the metal etching process 170, only a portion of the metal gate 160 is removed from the widened first recess 132W. More important, the metal gate 160 still remains in the widened first recess 132W, as shown in FIG. 10. Therefore, a top surface of the metal gate 160 is higher than the bottom of the widened first recess 132W (depicted by the dotted line) after the metal etching process 170. Then, the insulating cap layer 172 is formed only in the widened first recess 132W by the deposition and planarization processes. It is noteworthy that since the metal gate 160 remains in the widened first recess 132W, a cross-sectional view of the metal gate 160 includes a T shape. That is, the metal gate 160 is a T-shaped metal gate. The bottom of the insulating cap layer 172 entirely and only contacts the metal gate 160, particularly, the head of the T-shaped metal gate 160, as shown in FIG. 10. As mentioned above, the insulating cap layer 172 is formed to fill up the widened first recess 132W, and a top surface of the insulating cap layer 172 and the top surface of the ILD layer 120 are coplanar. Additionally, a height $H_2$ of the metal gate 160 and a thickness T of the insulating cap layer 172 include a ratio, and the ratio is between 1 and 1.5, but not limited to this.

According to the semiconductor device having metal and the method for manufacturing the semiconductor device having metal gate provided by the present invention, two-stepped removals are performed to remove the dummy gate. More important, the two-stepped removals are interrupted by the etching process performed to remove the portion of the ILD layer. Consequently, the widened first recess including a width larger than an original width of the dummy gate and the second recess including a width the same with the original width of the dummy gate are obtained. Thereafter, the insulating cap layer formed in the widened first recess obtains the width larger than metal gate, which obtains the width the same with the dummy gate. More important, since the width of the insulating cap layer is larger than the width of the metal gate, the insulating cap layer serves as a protecting shield obstructing the etchant used in an etching process for forming contact openings and protecting the metal gate from being exposed during forming the contact openings. And thus the conductive material formed in the contact opening will not contact the metal gate. Briefly speaking, the present invention provides the semiconductor device having metal and the method for manufacturing the semiconductor device having metal gate capable of avoiding GC short.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A semiconductor device having metal gate comprising:
   a substrate;
   a metal gate formed on the substrate;
   a pair of spacers formed on sidewalls of the metal gate;
   a contact etch stop layer (CESL) covering the spacers, wherein the metal gate, the spacers and the CESL comprises a first width;
   an insulating cap layer formed on the metal gate, the spacers and the CESL, the insulating cap layer comprising a second width, which is defined as a distance between two sidewalls of the insulating cap layer, and the second width being larger than the first width, wherein the insulating cap layer is monolithic; and
   an interlayer dielectric (ILD) layer surrounding the metal gate, the spacers, the CESL and the insulating cap layer, wherein the ILD layer directly contacts the two sidewalls of the insulating cap layer,
   wherein a bottommost of the insulating cap layer is entirely parallel to a top of the insulating cap layer and concurrently contacts a top of the metal gate, a top of the spacers and a top of the CESL, and the bottommost of the insulating cap layer and the top of the metal gate are coplanar.

2. The semiconductor device having metal gate according to claim 1, wherein a height of the metal gate and a thickness of the insulating cap layer comprise a ratio, and the ratio is between 1 and 1.5.

3. The semiconductor device having metal gate according to claim 1, wherein the insulating cap layer comprises a rectangle.

4. The semiconductor device having metal gate according to claim 1, wherein the insulating cap layer comprises a T shape.

5. A semiconductor device having metal gate comprising:
   a substrate;
   a metal gate formed on the substrate;
   a pair of spacers formed on sidewalls of the metal gate, the metal gate and the spacers comprising a first width;
   an insulating cap layer formed on the metal gate and the spacers, the insulating cap layer comprising a second width, which is defined as a distance between two sidewalls of the insulating cap layer, and the second width being larger than the first width, wherein the insulating cap layer is monolithic; and
   an interlayer dielectric (ILD) layer surrounding the metal gate, the spacers and the insulating cap layer, wherein the ILD layer directly contacts the two sidewalls of the insulating cap layer,
   wherein a bottommost of the insulating cap layer is entirely parallel to a top of the insulating cap layer, entirely and only contacts the metal gate and the spacer, and the bottommost of the insulating cap layer and a top of the metal gate are coplanar.

6. The semiconductor device having metal gate according to claim 5, wherein a height of the metal gate and a thickness of the insulating cap layer comprise a ratio, and the ratio is between 1 and 1.5.

7. The semiconductor device having metal gate according to claim 5, wherein the insulating cap layer comprises a T shape.

* * * * *